United States Patent
Park et al.

(10) Patent No.: US 7,842,995 B2
(45) Date of Patent: Nov. 30, 2010

(54) MULTI-BIT NON-VOLATILE MEMORY DEVICES AND METHODS OF FABRICATING THE SAME

(75) Inventors: Yoon-Dong Park, Yongin-si (KR); Won-Joo Kim, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 890 days.

(21) Appl. No.: 11/523,019

(22) Filed: Sep. 19, 2006

(65) Prior Publication Data

US 2007/0141781 A1 Jun. 21, 2007

(30) Foreign Application Priority Data

Dec. 20, 2005 (KR) .................. 10-2005-0126261

(51) Int. Cl.
*H01L 29/94* (2006.01)
(52) U.S. Cl. .................. 257/317; 257/E29.3
(58) Field of Classification Search .......... 257/317, 257/E29.3
See application file for complete search history.

(56) References Cited

U.S. PATENT DOCUMENTS

| | | | |
|---|---|---|---|
| 6,413,802 B1 | 7/2002 | Hu et al. | |
| 6,664,582 B2 | 12/2003 | Fried et al. | |
| 2002/0127805 A1* | 9/2002 | Ebina et al. | 438/266 |
| 2003/0141541 A1* | 7/2003 | Wu | 257/319 |
| 2005/0226047 A1* | 10/2005 | Hieda et al. | 365/185.14 |
| 2005/0242391 A1 | 11/2005 | She et al. | |
| 2005/0242406 A1 | 11/2005 | Hareland et al. | |
| 2005/0260814 A1 | 11/2005 | Cho et al. | |

OTHER PUBLICATIONS

European Search Report dated Jan. 14, 2009 for corresponding European Application No. 06126309.1-1235/1801857.
Chinese Office Action and English translation May 8, 2009.

* cited by examiner

*Primary Examiner*—Bradley K Smith
*Assistant Examiner*—Amar Movva
(74) *Attorney, Agent, or Firm*—Harness, Dickey & Pierce, P.L.C.

(57) ABSTRACT

A multi-bit non-volatile memory device may include a semiconductor substrate including a body and at least one pair of fins protruding above the body. A first insulation layer may be formed on the body between the at least one pair of fins. A plurality of pairs of control gate electrodes may extend across the first insulation layer and the at least one pair of fins, and may at least partly cover upper portions of outer walls of the at least one pair of fins. A plurality of storage nodes may be formed between the control gate electrodes and the at least one pair of fins, and may be insulated from the substrate. A first distance between adjacent pairs of control gate electrodes may be greater than a second distance between control gate electrodes in each pair.

6 Claims, 10 Drawing Sheets

MULTI-BIT NON-VOLATILE MEMORY DEVICES AND METHODS OF FABRICATING THE SAME

PRIORITY STATEMENT

This non-provisional U.S. patent application claims priority under 35 U.S.C. §119 to Korean Patent Application No. 10-2005-0126261, filed on Dec. 20, 2005, in the Korean Intellectual Property Office (KIPO), the entire contents of which is incorporated herein by reference.

BACKGROUND OF THE INVENTION

1. Field of the Invention

Example embodiments of the present invention relate to semiconductor memory devices, for example, non-volatile memory devices having a floating node and/or a trap-type node as a storage node, and methods of fabricating the same.

2. Description of the Related Art

Related art flash memory devices have a floating node such as a polysilicon film as a storage node. Related art silicon-oxide-nitride-oxide-silicon (SONOS) memory devices have a trap-type node such as silicon nitride film as a storage node. In a related art non-volatile memory device, limited memory integration and/or speed may result from limitations in forming fine patterns.

A related art Fin-FET may use top and side surfaces of a fin structure as a channel region. Therefore, the Fin-FET may have a larger channel area as compared to a planar transistor, which may result in a higher current flow. As a result, the Fin-FET may provide higher performance than the planar transistor.

However, because related art Fin-FETs are fabricated using a silicon-on-insulator (SOI) substrate, the fin is floated from the body of the substrate making it more difficult to control the threshold voltage of the transistor using a body-bias. As a result, it may be more difficult to control the threshold voltage of a complementary metal-oxide-semiconductor (CMOS) transistor. Furthermore, because the related art fin memory cell uses an area of at least 2 F×2 F to provide 2-bit operation when the gate length is 1 F, the area per bit is 2 $F^2$/bit. An area per bit of 2 $F^2$/bit may limit the performance of the fin memory cell.

SUMMARY OF THE INVENTION

Example embodiments of the present invention provide a non-volatile memory device that occupies less area per bit and may perform multi-bit operation. Example embodiments of the present invention also provide a method of fabricating the NAND type non-volatile memory device.

In at least one example embodiment of the present invention, a multi-bit non-volatile memory device may include a semiconductor substrate. The semiconductor substrate may include a body and at least one pair of fins protruding above the body. A first insulation layer may be formed on the body between the paired fins, and a plurality of control gate electrodes may extend across the first insulation layer and the fins and may at least partly cover upper portions of outer walls of the fins. The control gate electrodes may be insulated from the semiconductor substrate. A plurality of storage nodes may be interposed between the control gate electrodes and the fins and insulated from the semiconductor substrate. The control gate electrodes may be sequentially paired into groups of two and a first distance between adjacent control gate electrodes included in respective adjacent pairs may be greater than a second distance between the control gate electrodes of each pair.

In example embodiments of the present invention, the NAND type multi-bit non-volatile memory device may further include a plurality of contact plugs contacting respective sidewalls near edges of the control gate electrodes. The contact plugs contacting the control gate electrodes of each pair may be arranged on the same side, and the contact plugs contacting adjacent control gate electrodes included in respective adjacent pairs may be arranged at opposite sides.

In another example embodiment of the present invention, a semiconductor substrate including a body and at least one pair of fins may be provided. The fins may protrude above the body. Between the pair of fins, a first insulation layer may be interposed. A second insulation layer may be on a portion of the body at an outer side of the paired fins and may expose an upper portion of outer walls of the paired fins. A plurality of storage nodes may be formed on upper portions of outer walls of the paired fins. A plurality of preliminary control gate electrodes may be formed extending across the first insulation layer, the second insulation layer and the fins and may cover the storage nodes. The preliminary control gate electrodes may be spaced apart from each other by third insulation layers. A plurality of pairs of control gate electrodes may be formed on respective sidewalls of the third insulation layers by forming a trench located in each of the preliminary control gate electrodes and extending across the paired fins. The control gate electrodes may be sequentially paired into groups of two and a first distance between adjacent control gate electrodes included in respective adjacent pairs may be greater than a second distance between the control gate electrodes of each pair.

In example embodiments of the present invention, a plurality of contact plugs contacting respective sidewalls near edges of the control gate electrodes may be formed.

BRIEF DESCRIPTION OF THE DRAWINGS

The present invention will become more apparent by describing in detail example embodiments thereof with reference to the attached drawings in which.

DETAILED DESCRIPTION OF EXAMPLE EMBODIMENTS OF THE PRESENT INVENTION

Figure 1:
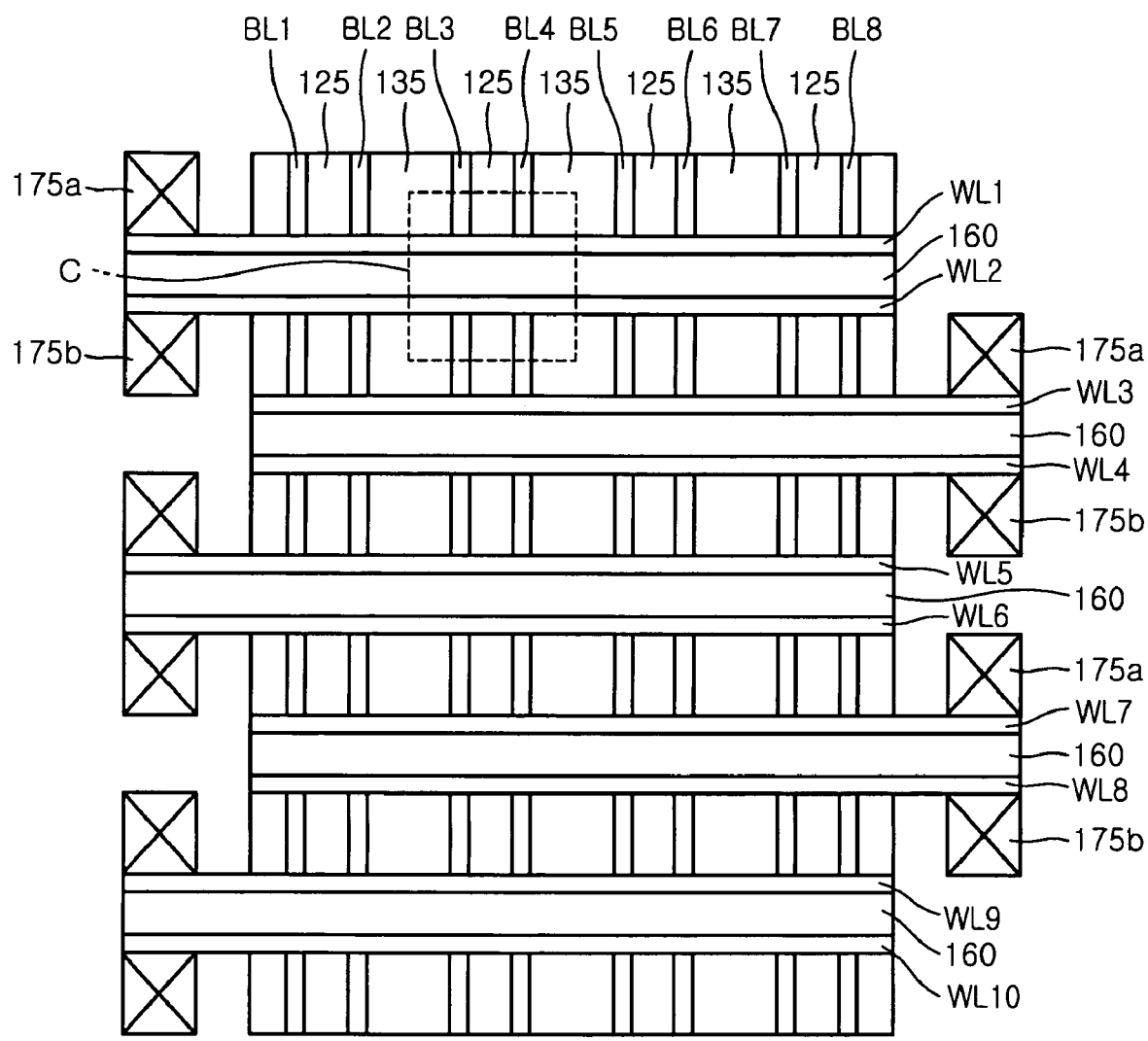
FIG. 1 is a schematic view of the layout of a non-volatile memory device according to an example embodiment of the present invention.

Various example embodiments of the present invention will now be described more fully with reference to the accompanying drawings in which some example embodiments of the invention are shown. In the drawings, the thicknesses of layers and regions are exaggerated for clarity.

Detailed illustrative embodiments of the present invention are disclosed herein. However, specific structural and functional details disclosed herein are merely representative for purposes of describing example embodiments of the present invention. This invention may, however, may be embodied in many alternate forms and should not be construed as limited to only the embodiments set forth herein.

Accordingly, while example embodiments of the invention are capable of various modifications and alternative forms, embodiments thereof are shown by way of example in the drawings and will herein be described in detail. It should be understood, however, that there is no intent to limit example embodiments of the invention to the particular forms disclosed, but on the contrary, example embodiments of the invention are to cover all modifications, equivalents, and alternatives falling within the scope of the invention. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments of the present invention. As used herein, the term "and/or" includes any and all combinations of one or more of the associated listed items.

It will be understood that when an element or layer is referred to as being "formed on" another element or layer, it can be directly or indirectly formed on the other element or layer. That is, for example, intervening elements or layers may be present. In contrast, when an element or layer is referred to as being "directly formed on" to another element, there are no intervening elements or layers present. Other words used to describe the relationship between elements or layers should be interpreted in a like fashion (e.g., "between" versus "directly between", "adjacent" versus "directly adjacent", etc.).

The terminology used herein is for the purpose of describing particular embodiments only and is not intended to be limiting of example embodiments of the invention. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the FIGS. For example, two FIGS. shown in succession may in fact be executed substantially concurrently or may sometimes be executed in the reverse order, depending upon the functionality/acts involved.

FIG. 1 is a schematic view of a non-volatile memory device according to an example embodiment of the present invention. Non-volatile memory devices, according to at least one example embodiment of the present invention, may be flash memories having a floating node, or a SONOS memory having a trap-type node. A non-volatile memory device, according to at least one example embodiment of the present invention, may have a NAND structure. FIG. 1 illustrates a cell region of a NAND type non-volatile memory device, according to an example embodiment of the present invention.

Referring to FIG. 1, a plurality of bit lines BL1 through BL8 may be arranged in columns, and a plurality of word lines WL1 through WL10 may be arranged in rows. The rows and columns may be interchanged. The numbers of bit lines and word lines shown in FIG. 1 are only examples, and are not intended to be limiting in any way.

First ends of the bit lines BL1 through BL8, for example, portions of the bit lines BL1 through BL8 located at the outer side of the tenth word line WL10, may be connected to a common source line (not shown). In addition, a ground section line (not shown) forming a ground section transistor may be interposed between the tenth word line WL10 and the common source line. A string section line (not shown) forming a string section transistor may be located at the outer side of the first word line WL1. The common source, ground selection and string selection lines are well known in the art, and therefore, a detailed description of these components will be omitted for the sake of brevity.

First and second device isolating insulation layers 125 and 135 may be alternately located between the bit lines BL1 through BL8. For example, the first device isolating insulation layer 125 may be located between the first and second bit lines BL1 and BL2, and the second device isolating insulation layer 135 may be located between the second and third bit lines BL2 and BL3. The bit lines BL1 through BL8 may be paired such that a bit line located on each side of each respective first device isolating insulation layer 125 makes a pair. For example, the first and second bit lines BL1 and BL2 may make a first pair, and the third and fourth bit lines BL3 and BL4 may make a second pair. Similarly, the other word lines WL5 through WL10 may also be paired.

A first pair of contact plugs 175a and 175b may be formed on edge sidewalls of a first pair of word lines WL1 and WL2, respectively. For example, as shown in FIG. 1, the first pair of contact plugs 175a and 175b corresponding to the first pair of word lines WL1 and WL2 may be formed on the left side of the bit lines BL1 through BL8. Similarly, other pairs of contact plugs 175a and 175b may be formed on second to fifth pairs of word lines WL3 and WL4, WL5 and WL6, and WL9 and WL 10. The first pair of contact plugs 175a and 175b of the first pair of word lines WL1 and WL 2 may be formed on the same side. The second pair of contact plugs 175a and 175b of the second pair of word lines WL3 and WL4, which are adjacent to the first pair of word lines WL1 and WL2, may be formed on the opposite side to the first pair of contact plugs 175a and 175b. For example, the first pair of contact plugs 175a and 175b of the first pair of word lines WL1 and WL2 may be formed on the left side, while the second pair of contact plugs 175a and 175b of the second pair of word lines WL3 and WL4 may be formed on the right side. The contact plugs 175a and 175b may be paired and arranged in a zigzag or staggered pattern.

The staggered arrangement of the pairs of contact plugs 175a and 175b may increase integration of devices, according to example embodiments of the present invention. When all or substantially all contact plugs 175a and 175b are arranged on the same side, the distance between the pairs of word lines may increase to suppress (e.g., prevent) short circuits between the pairs of contact plugs 175a and 175b. This may reduce the integration of the device. According to example embodiments of the present invention, the pairs of contact plugs 175a and 175b may be arranged in a staggered pattern and the distance between the pairs of word lines may decrease.

The second pair of bit lines BL3 and BL4 and the first pair of word lines WL1 and WL2 may be located in an area C and may form a unit cell 100 of the NAND cell shown in FIG. 1.

Figure 2:
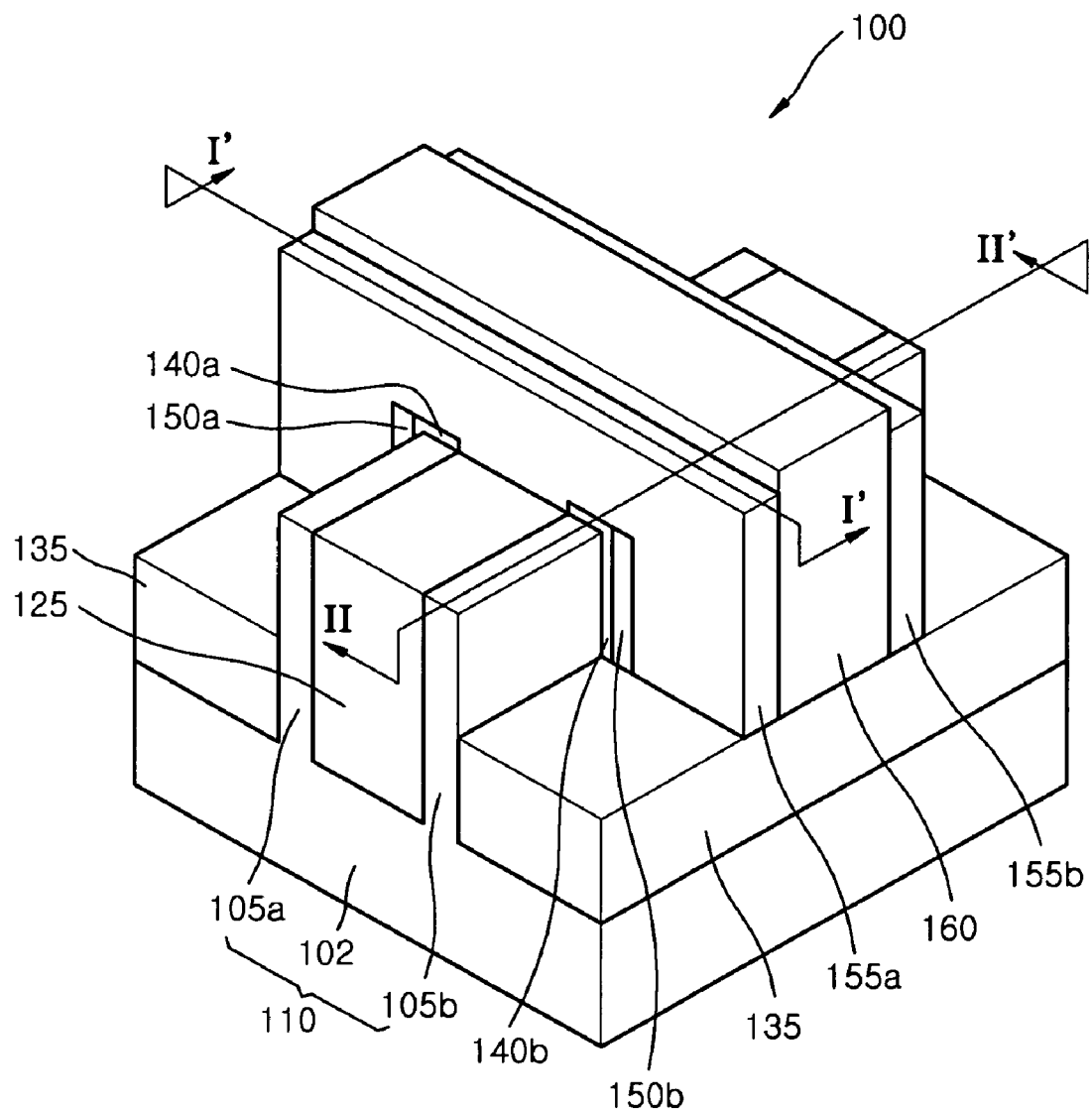
FIG. 2 is a perspective view of a unit cell of the non-volatile memory device depicted in FIG. 1.
Figure 3:
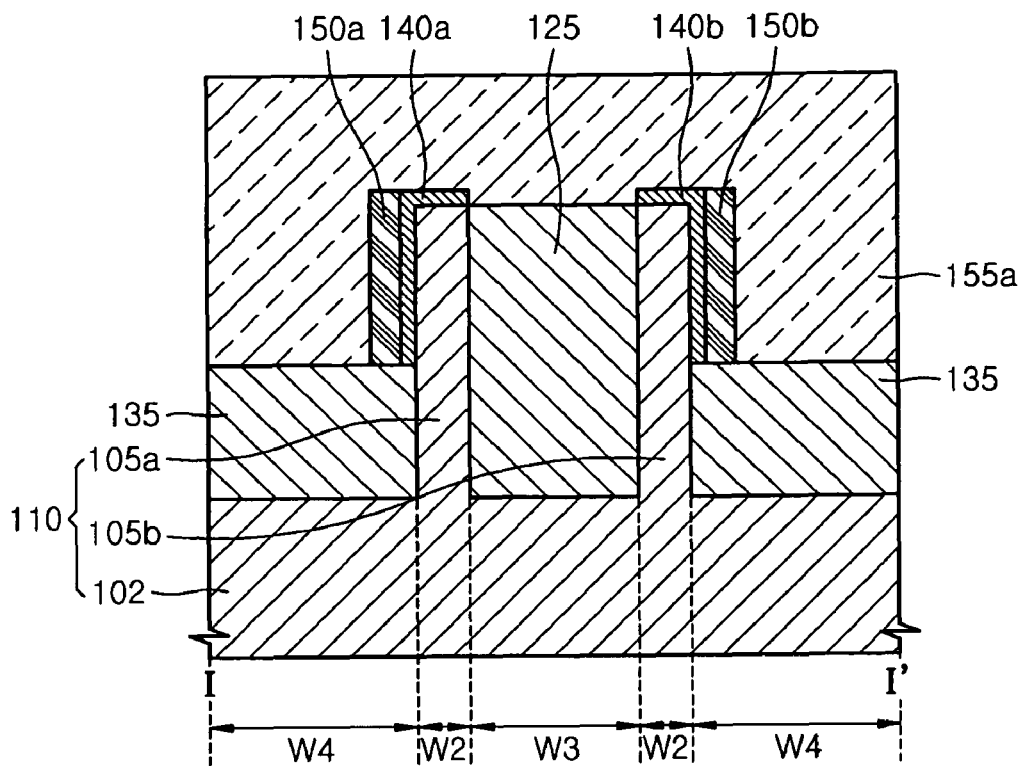
FIG. 3 is a cross-sectional view taken along line I-I' of FIG. 2.
Figure 4:
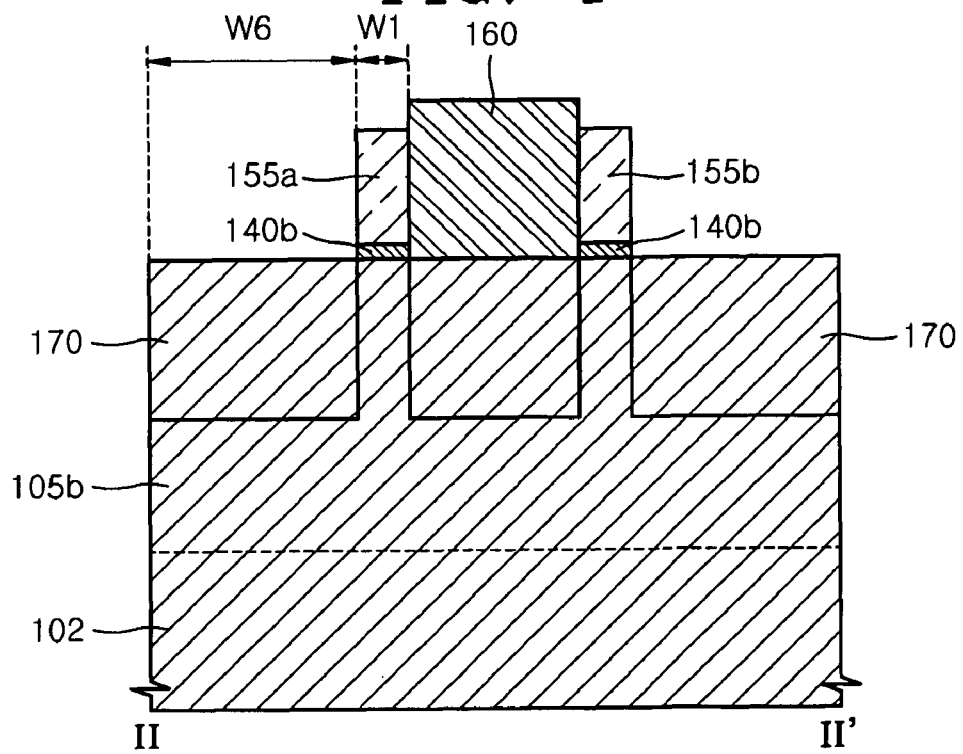
FIG. 4 is a cross-sectional view taken along line II-II of FIG. 2.

FIG. 2 is a perspective view of a unit cell of a non-volatile memory device, according to an example embodiment of the present invention. FIG. 3 is a cross-sectional view taken along line I-I' of FIG. 2. FIG. 4 is a cross-sectional view taken along line II-II of FIG. 2.

Referring to FIGS. 2 through 4, a semiconductor substrate 110 may include a body 102 and a pair of fins 105a and 105b. The pair of fins 105a and 105b form the second pair of bit lines BL3 and BL4, and a pair of control gate electrodes 155a and 155b form the first pair of word lines WL1 and WL2. The first device insulation layer 125 may be formed in between the fins 105a and 105b. A second device isolating insulation layer 135 may be formed on the body 102 to contact the outer walls of the fins 105a and 105b. The control gate electrodes 155a and 155b may extend across the fins 105a and 105b and the first and second device isolating insulation layers 125 and 135. The control gate electrodes 155a and 155b may at least partly cover the upper portions of the outer walls of the fins 105a and 105b, and may be insulated from the semiconductor substrate 110. Storage nodes 150a and 150b may be located between the upper portions of the outer walls of the fins 105a and 105b and the control gate electrodes 155a and 155b.

The fins 105a and 105b may protrude upwards from the body 102 of the semiconductor substrate 110 and may be spaced apart from each other. For example, the fins 105a and 105b may be spaced apart from each other in a direction X1 and extend in a direction X2. The semiconductor substrate 110 may be formed of, for example, bulk silicon, bulk silicon-germanium or any other semiconductor material having similar or substantially similar properties. Alternatively, the semiconductor substrate may be formed in a multi-layer structure. The multilayer structure may have a first layer formed of, for example, bulk silicon or bulk silicon-germanium and a second layer (e.g., a second epitaxial layer) formed of, for example, silicon or silicon-germanium. In at least one example embodiment, the fins 105a and 105b may be formed of the same or substantially the same material as the body 102. Alternatively, in at least one other example embodiment of the present invention, the fins 105a and 105b may be formed of a different material, for example, an epitaxial layer formed on the body 102.

As discussed above, the first device insolating insulation layer 125 may be formed between the fins 105a and 105b, and the second device isolating insulation layer 135 may be formed on the body 102 to contact the outer walls of the fins 105a and 105b. For example, the second device isolating insulation layer 135 may cover a lower portion of the outer walls of the fins 105a and 105b, but may expose an upper portion of the outer walls of the fins 105a and 105b. The first and second device isolating insulation layers 125 and 135 may isolate the fins 105a and 105b from one another and from other fins (not shown). For example, each of the first and second device isolating insulation layers 125 and 135 may include a silicon oxide layer or a layer formed of any suitable semiconductor material with similar or substantially similar properties.

In at least one example embodiment of the present invention, the control gate electrodes 155a and 155b may be formed on the semiconductor substrate 110 having an SOI-like structure. The SOI-like structure differs from related art SOI structures in that the fins 105a and 105b may be connected to the body 102 in a direction X3, whereas an active region of related art SOI structures is floated from the body. Accordingly, the structure of the semiconductor substrate 110, according to an example embodiment of the present invention, is referred to as an SOI-like structure, which will be described in more detailed below.

Gate insulation layers 140a and 140b may be formed on the outer walls and top surface of the fins 105a and 105b. The gate insulation layers 140a and 140b may function as tunneling passages and will be referred to as tunneling insulation layers. For example, the gate insulation layers 140a and 140b may be formed of a silicon oxide layer, a silicon nitride layer, a high-K dielectric layer, a multi-layer structure including one or more of these layers or any other suitable material or structure.

The storage nodes 150a and 150b may be interposed between portions of the gate insulation layers 140a and 140b and portions of the control gate electrodes 155a and 155b. According to at least one example embodiment of the present invention, the storage nodes 150a and 150b may be formed on the upper portions of the outer walls of the fins 105a and 105b. Alternatively, in at least one other example embodiment of the present invention, the storage nodes 150a and 150b may extend to the top surfaces of the fins 105a and 105b.

Each of the storage nodes 150a and 150b may include a polysilicon layer, a silicon-germanium layer, a silicon or metal area (e.g., dot), and/or a nano-crystal or a silicon nitride layer. Storage nodes 150a and 150b including, for example, the polysilicon layer or the silicon-germanium layer may be used as floating nodes. The storage nodes 150a and 150b including, for example, the silicon or metal area, the nano-crystal or the silicon nitride layer may be used as charge trap nodes.

Channels (not shown) functioning as conductive passages for charges may be formed at upper end portions of the outer walls of the fins 105a and 105b and near the top surfaces of the fins 105a and 105b. The channel may not be formed on the inner walls of the fins 105a and 105b, between which the first device isolating insulation layer 125 is formed. The primary (e.g., major) conductive passages of the charges may be formed on the outer walls of the fins 105a and 105b based on (or considering) a relative area.

By adjusting the heights of the portions of the fins 105a and 105b not covered by the second device isolating insulation layer 135, the area of the channel may be adjusted. When fins 105a and 105b, according to example embodiments of the present invention, are used the operating current (e.g., the speed of the non-volatile memory device) may increase and/or the performance of the non-volatile memory device may improve.

Impurity regions 170 may be formed near the surfaces of the fins 105a and 105b at both sides of the control gate electrodes 155a and 155b. The impurity regions 170 may serve as source and drain regions. The impurity regions 170 may be connected to the semiconductor substrate 110, for example, by diode-junctions. For example, when the impurity regions 170 are doped with n-type impurities, the semiconductor substrate 110 may be doped with p-type impurities. However, the n-type and p-type impurities may be interchanged.

The control gate electrodes 155a and 155b may extend in the direction X1 and may be spaced apart from each other in a direction X2. An intergate insulation layer 160 may be formed (or interposed) between the control gate electrodes 155a and 155b. The intergate insulation layer 160 may protrude or extend above the top surfaces of the control gate electrodes 155a and 155b. For example, each of the control gate electrodes 155a and 155b may include a polysilicon layer, a metal layer, a metal silicide layer or a multi-layer including the polysilicon, metal and/or metal silicide layers. The intergate insulation layer 160 may include, for example, a silicon oxide layer or a layer or layer structure having similar insulating properties.

The unit cell 100 may further include a blocking insulation layer (not shown) for insulating the control gate electrodes 155a and 155b from the storage nodes 150a and 150b. For example, the blocking insulation layer may be formed between the storage nodes 150a and 150b and the control gate electrodes 155a and 155b, and between the first device isolation insulation layer 125 and the control gate electrodes 155a and 155b. The blocking insulation layer may include, for example, a silicon oxide layer or a layer or layer structure having similar insulating properties.

In example operation of the unit cell 100, the expansion of a depletion region formed on the fins 105a and 105b may be limited. For example, as the widths of the fins 105a and 105b are reduced, the expansion of the depletion region may be limited. The depletion region may be limited in the direction X1 (the direction of the widths of the fins 105a and 105b), but may extend in the direction X3. However, when the widths of the fins 105a and 105b are reduced, the influence or function of the depletion region formed in the direction X3 may be suppressed.

Accordingly, although the fins 105a and 105b are connected to the body 102, the fins 105a and 105b may form an SOI-like structure similar to the SOI structure. Therefore, an off-current and a junction leakage current, generated, for example, by the expansion of the depletion region, may be reduced.

Referring to FIGS. 3 and 4, the gate length W1 of each of the control gate electrodes 155a and 155b may be about 0.25 F, the width W2 of each of the fins 105a and 105b may be about 0.25 F, and the width W3 of the first device isolating insulation layer 125 may be about 0.5 F. The overall width of the second device isolating insulation layer 135 included in the unit cell 100 may be about 2×W4 or 2×0.5 F=1 F. The width of the unit cell 100 in the direction X1 may be about 2 F.

The distance between the control gate electrodes 155a and 155b, which corresponds to the distance between the second pair of word lines WL3 and WL4, may be about 0.5 F. The overall width of the impurity region, which corresponds to the distance between adjacent word lines included in respective adjacent pairs, for example, between the second word line WL2 of the first pair and the third word line WL3 of the second pair, may be about 2×W6 or 2×0.5 F=1 F. The distance between adjacent word lines included in respective adjacent pairs may be two times the distance between the paired word lines. The area of the unit cell 100 including the pair of fins 105a and 105b and the pair of control gate electrodes 155a and 155b may be about 2 F332 F=4 $F^2$.

In an example single level operation, the unit cell 100 may use the pair of fins 105a and 105b as the third and fourth bit lines BL3 and BL4 and may use the pair of control gate electrodes 155a an 155b as the first and second word lines WL1 and WL2 to enable processing of multi-bit data, such as, 2×2-bit data=4-bit data). Furthermore, in an example multi-level operation method, each of the control gate electrodes 155a and 155b may process multi-bit (e.g., 2-bit data) by controlling program time enabling the unit cell 100 to process multi-bit (e.g., 2×2×2 bit data=8-bit data)). Because the unit cell 100 may process multi-bit data, the area of the unit cell 100 per unit bit may be about 4 $F^2$/8=0.5 $F^2$/bit. Therefore, the area of the unit cell 100 per unit bit may be reduced to about one-fourth of the area of the related art unit cell per unit bit (e.g., 2 $F^2$/bit).

FIGS. 5 through 14 are sectional views illustrating a method of fabricating a non-volatile memory device according to an example embodiment of the present invention. A non-volatile memory device fabricated according to this embodiment may correspond to the unit cell 100 depicted in FIG. 2. In FIGS. 2 through 14, like reference numbers refer to like parts.

Figure 5:
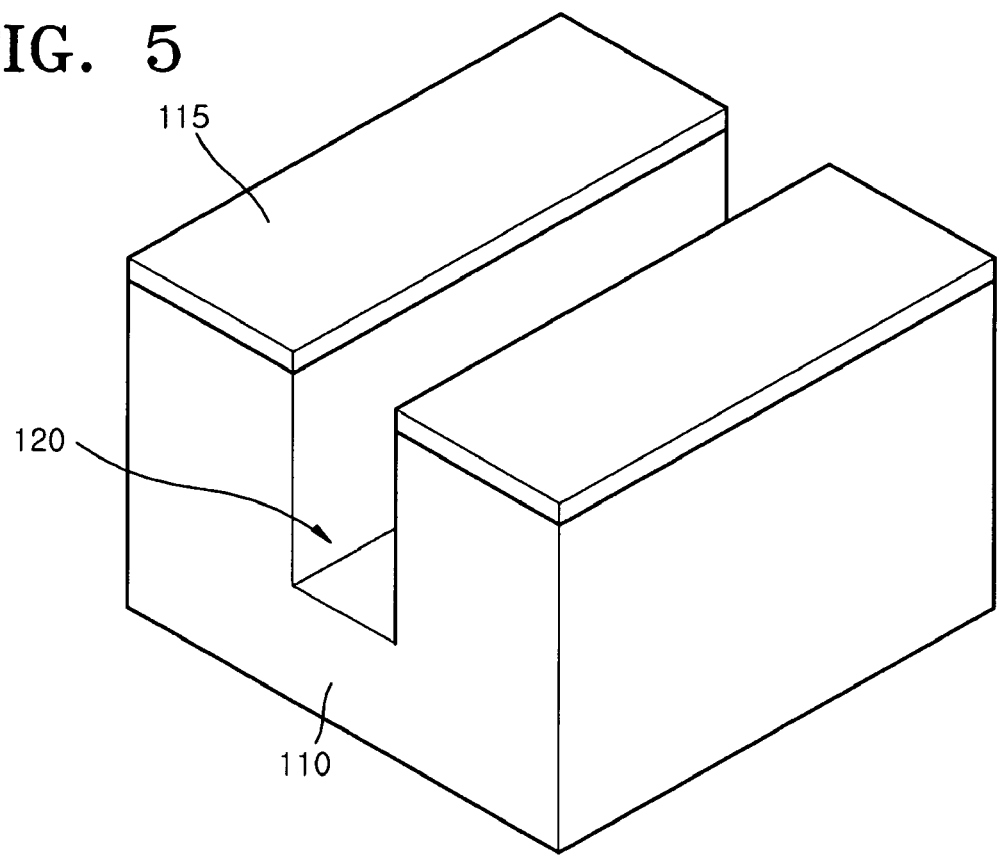
FIGS. 5 through 14 are cross-sectional views illustrating a method of fabricating a non-volatile memory device, according to an example embodiment of the present invention.

Referring first to FIG. 5, a first mask pattern (e.g., a hard mask pattern) 115 may be formed on the semiconductor substrate 110. The semiconductor substrate 110 may be formed of, for example, bulk silicon or bulk silicon-germanium. Alternatively, the semiconductor substrate may have a multi-layer structure including a layer formed of bulk silicon or bulk silicon-germanium, and an epitaxial layer formed of silicon or silicon-germanium. The first mask pattern 115 may be formed to expose a region where a first trench 120 may be formed. For example, the first mask pattern 115 may be formed in a line pattern extending straight or substantially straight. Although two straight lines are illustrated in FIG. 5, the line pattern may include more than two straight lines.

The first mask pattern 115 may be formed by forming a first mask layer (e.g., hard mask layer (not shown)) on the semiconductor substrate 110 and patterning the first mask layer. The patterning may be performed using, for example, photolithography or etching. The first mask layer may be formed of a material having an etch selectivity relative to the semiconductor substrate 110. The first mask layer may include, for example, a nitride layer or an oxynitride layer.

The semiconductor substrate 110 may be etched using the mask pattern 115 as an etching mask, to form the first trench 120. The depth of the first trench 120 may be selected according to the height of the fins (e.g., 105a and 105b of FIG. 8). Although only one first trench 120 is illustrated in FIG. 1, a plurality of first trenches 120 may be formed, for example, in an array.

Figure 6:
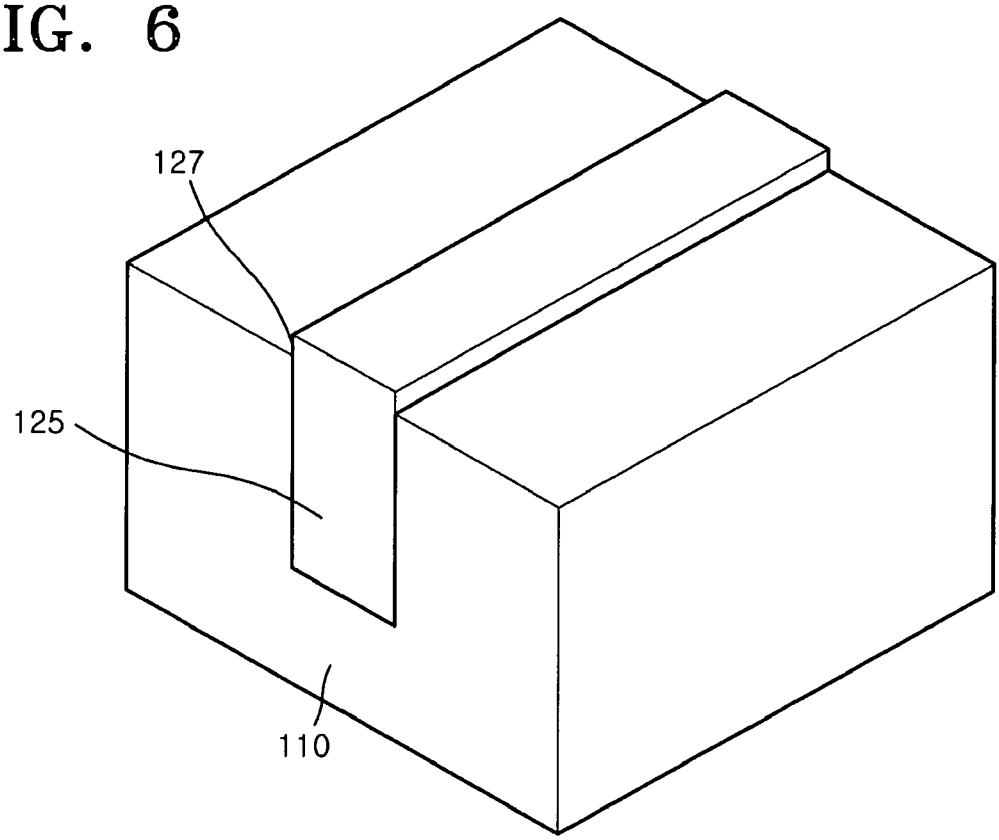

Referring to FIG. 6, the first device isolating insulation layer 125 may be formed to fill the first trench (e.g., 120 of FIG. 5). For example, an insulation layer (not shown) for the first device isolating insulation layer 125 may be deposited to fill the first trench 120. The insulation layer may include, for example, an oxide layer. The insulation layer may be etched using etch-back or chemical mechanical polishing (CMP) until the mask pattern (115 of FIG. 15) is exposed, thereby forming the first device isolating insulation layer 125.

The first mask pattern 115 may be selectively removed, leaving the first device isolating insulation layer 125 filling the first trench (120 of FIG. 2) in the semiconductor substrate 110 and protruding or extending above the top surface of the semiconductor substrate 110.

Figure 7:
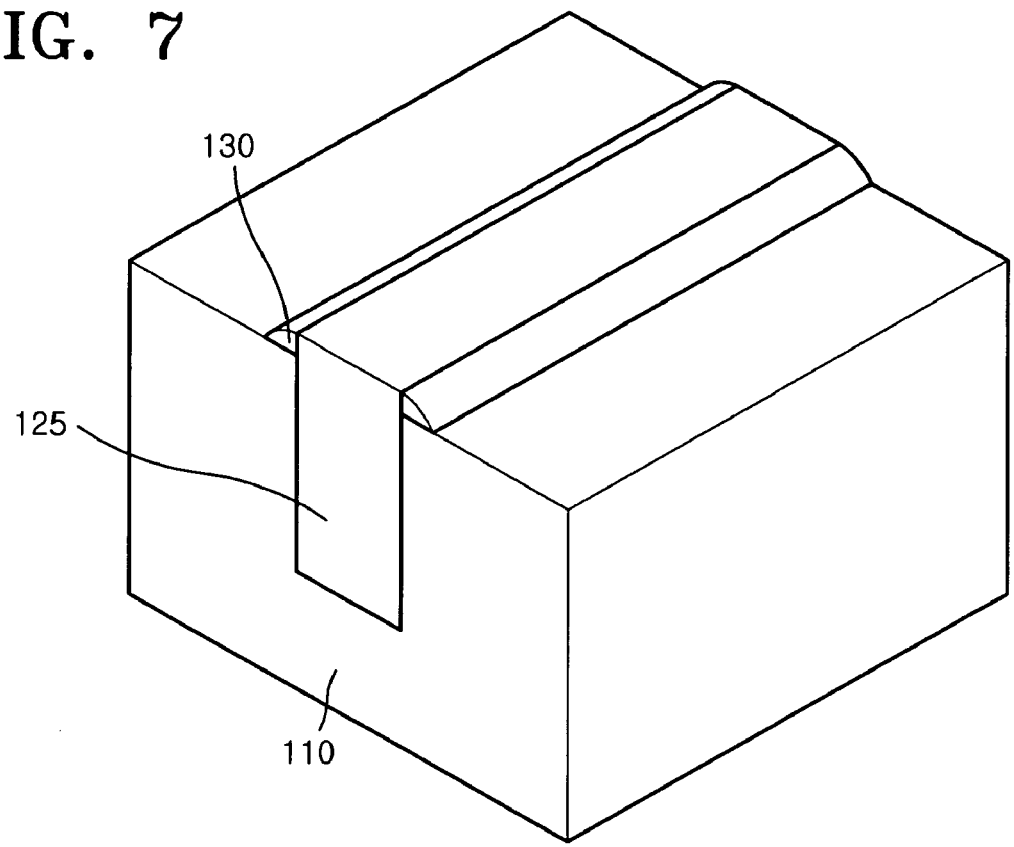

Referring to FIG. 7, a first insulation spacer 130 may be formed on each sidewall of the protruding portion of the first device isolation insulation layer 125. The first insulation spacers 130 may cover portions of the semiconductor substrate 110 where the fins (105a and 105b of FIG. 8) may be formed.

The first insulation spacers 130 may be formed by depositing and etching a material layer. For example, a first insulation spacer layer (not shown) may be formed on the first device isolating insulation layer 125. The first insulation spacer layer may be etched (e.g., anisotropically etched) to form the first insulation spacer 130 on each sidewall 127 of the protruding portion of the first device isolating insulation layer 125. For example, the first insulation spacers 130 may be formed on the sidewalls of the first device isolating insulation layer 125, for example, using a self-alignment or any other suitable method.

The width of the first insulation spacer 130 may be adjusted by controlling the thickness of the first insulation spacer layer. For example, the first insulation spacer layer may include a nitride layer, an oxynitride layer or any other suitable layer.

Figure 8:
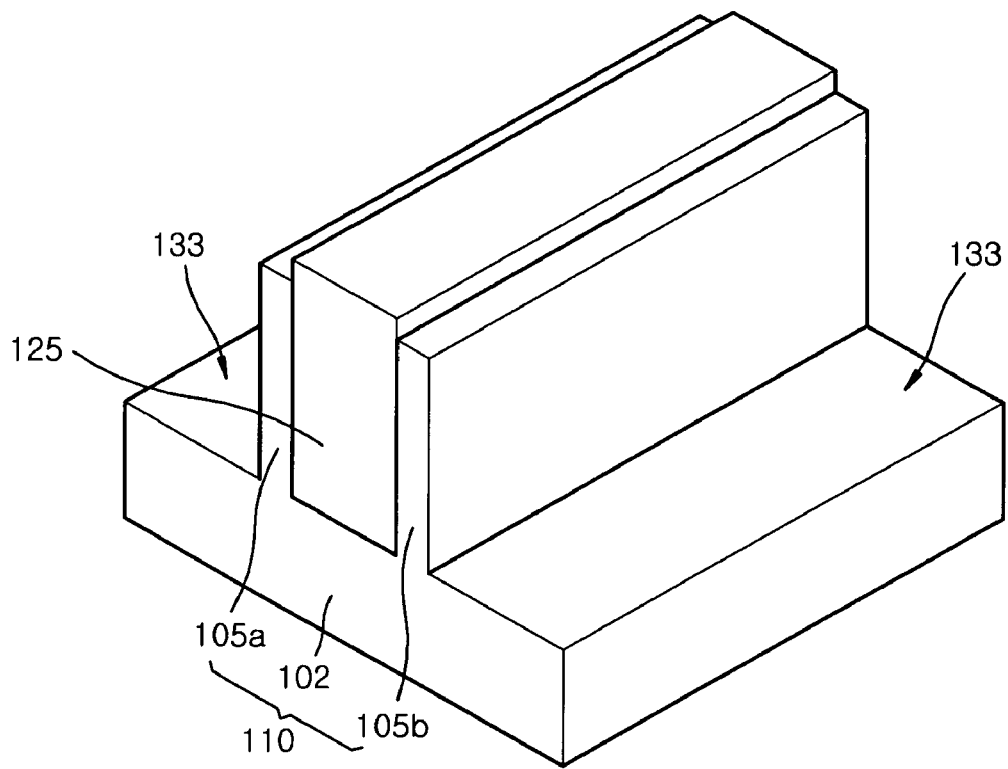

Referring to FIG. 8, the exposed portion of the semiconductor substrate 110 may be etched to form a second trench 133 using the first insulation spacers (130 of FIG. 7) as an etching mask. As a result, at least one pair of fins 105a and 105b abutting the sidewalls of the first device isolating insulation layer 125 and protruding above the body 102 of the semiconductor substrate 110 may be formed. For example, the semiconductor substrate 110 may include the body 102 and the pair of fins 105a and 105b.

The widths of the fins 105a and 105b may be determined based on the widths of the first insulation spacers 130. For example, by adjusting the widths of the first insulation spacers 130, the widths of the fins 105a and 105b may be adjusted, and fins 105a and 105b each having a sub-micro-scale width may be formed. The side surface of each of the fins 105a and 105b may contact and be supported by the first device isolating insulation layer 125, thereby enabling the fins 105a and 105b to be formed higher and thinner, while suppressing the likelihood that the fins 105a and 105b collapse during or after fabrication.

Although only one pair of fins 105a and 105b is illustrated in the figures, a plurality of device isolating insulation layers 125 may be formed, for example, in an array, and pairs of fins 105a and 105b may be formed on the sidewalls of each device isolating insulation layers 125.

Figure 9:
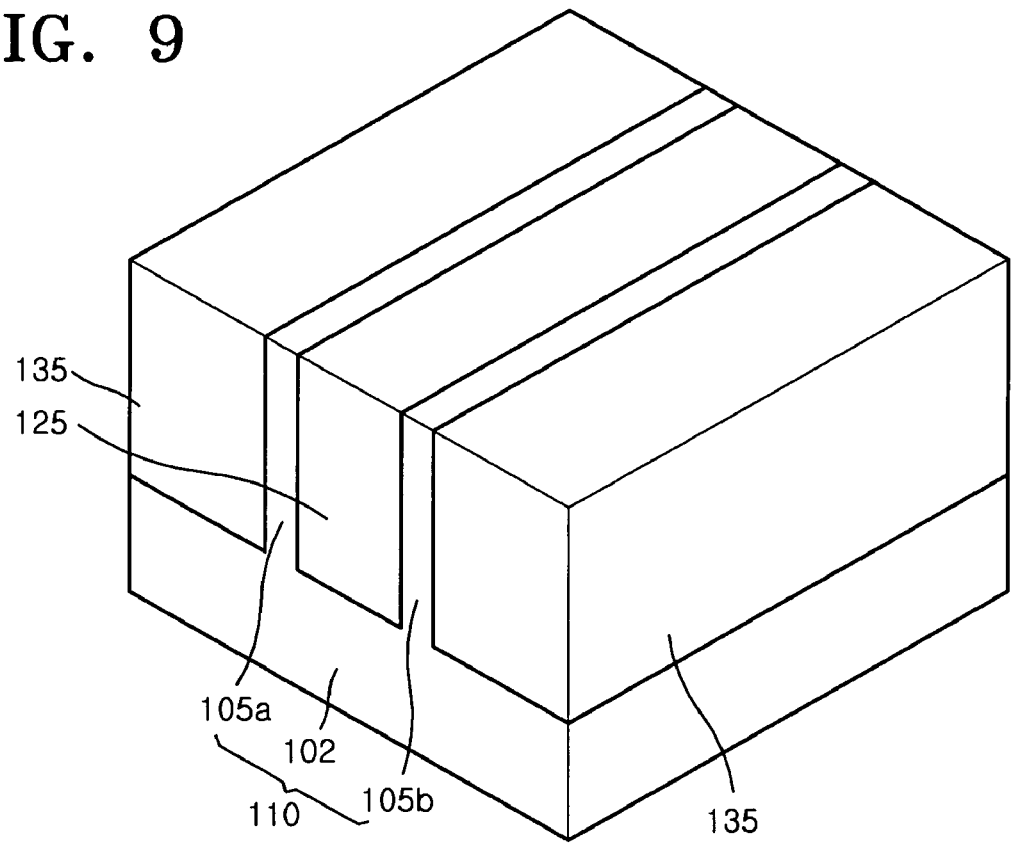

Referring to FIG. 9, the second device insulation layer 135 may be formed in the second trench (133 of FIG. 8). The second device insulation layer 135 may include, for example, a silicon oxide layer or any other similar insulation layer. For example, an insulation layer (not shown) for the second device isolating insulation layer may be formed on the structure depicted in FIG. 8. The insulation layer may be etched until the fins 105a and 105b are exposed, thereby forming the second device isolating insulation layer 135.

Figure 10:
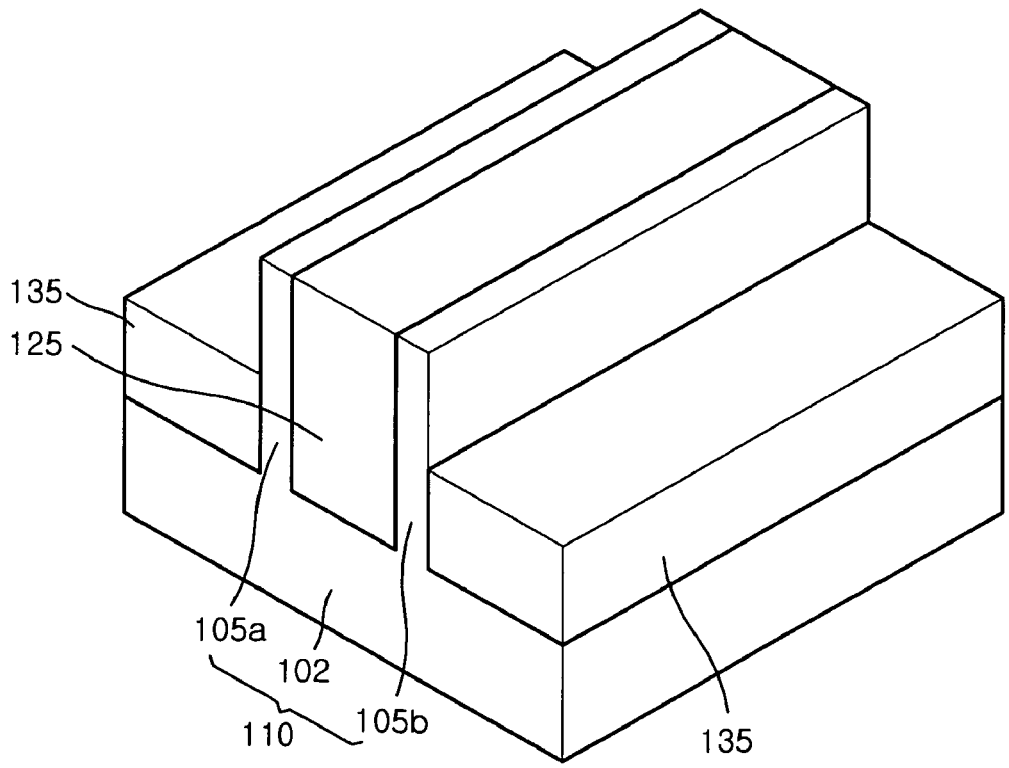

Referring to FIG. 10, the second device insulation layer 135 may be selectively etched to expose the upper portions of the fins 105a and 105b. For example, a second mask pattern (e.g., hard mask pattern (not shown)) may be formed to cover the first device insulation layer 125, and the second device insulation layer 135 may be selectively etched using the second mask pattern as an etching mask.

Figure 11:
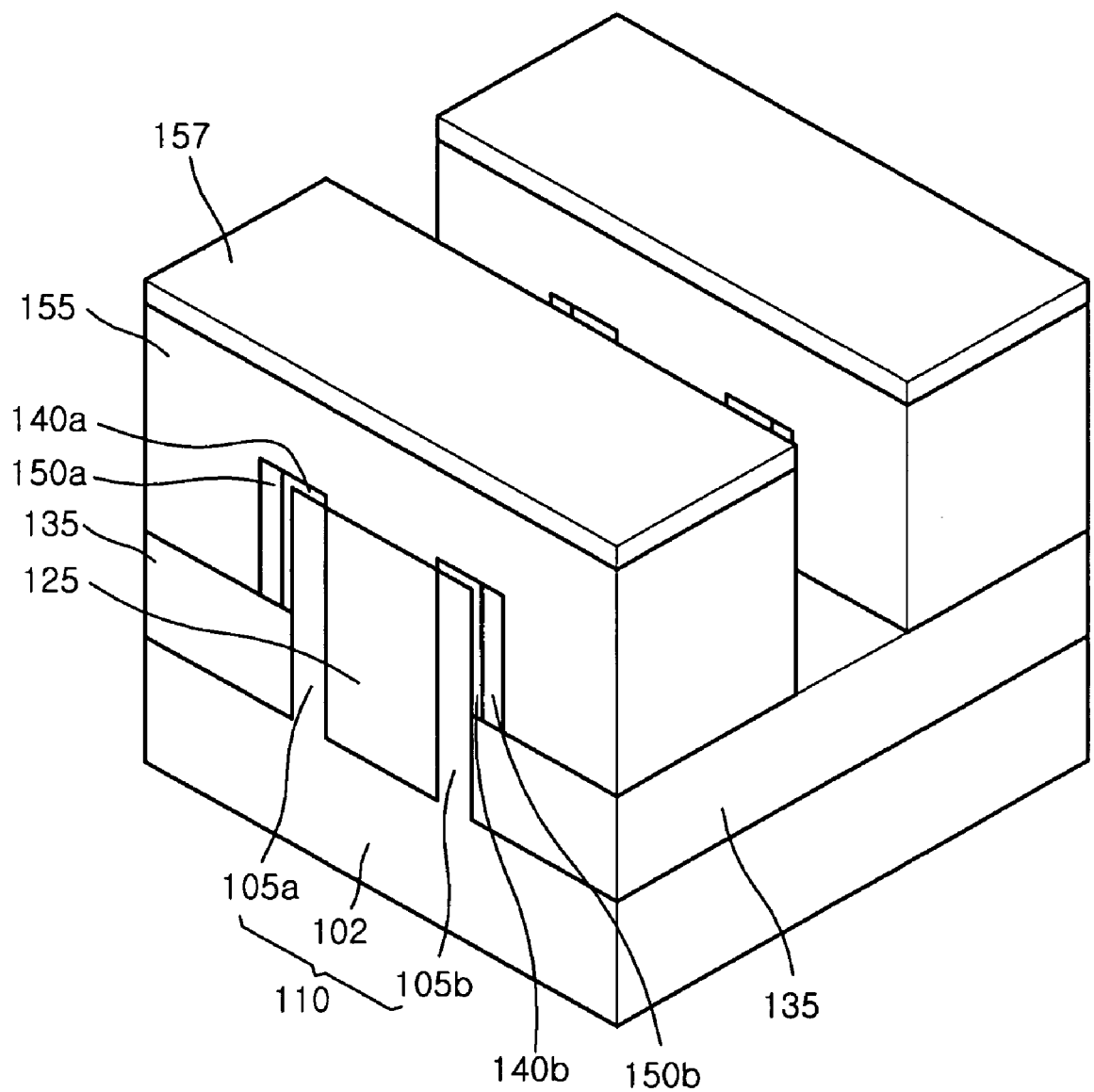

Referring to FIG. 11, the gate insulation layers 140a and 140b may be formed on the exposed portion of the fins 105a and 105b. The gate insulation layers 140a and 140b may be formed on the top portions and the outer side of the upper portions of the fins 105a and 105b. The gate insulation layers 140a and 140b may be formed, for example, by thermally oxidizing the fins 105a and 105b.

Storage nodes 150a and 150b, at least partly covering the gate insulating layers 140a and 140b may be formed to cover portions of the gate insulation layers 140a and 140b. For example, the storage nodes 150a and 150b may be formed at the outer sides of the fins 105a and 105b. The storage node layers 150a and 150b may be formed by depositing a storage node layer (not shown) and etching the storage node layer using, for example, anisotropic dry etching, or any other suitable method. Each of the storage nodes 150a and 150b may include a polysilicon layer, a silicon-germanium layer, a silicon or metal area or dot, a nano-crystal, a silicon nitride layer, or a layer of material having similar or substantially similar properties.

Alternatively, in another example embodiment of the present invention, a blocking insulation layer (not shown) covering the storage nodes 150a and 150b may be formed. The blocking insulation layer may be formed by depositing a silicon oxide layer on the resultant structure on which the storage nodes 150a and 150b are formed.

Preliminary control gate electrodes 155 may be formed to cover the storage nodes 150a and 150b. The preliminary control gate electrodes 155 may extend across the fins 105a and 105b and the first and second device insulation layers 125 and 135. The preliminary control gate electrodes 155 may be spaced apart from each other in the direction in which the fins 105a and 105b extend. For example, a preliminary control gate electrode layer (not shown) may be formed on the resultant structure on which the storage nodes 150a and 150b are formed. A third mask pattern (e.g., hard mask pattern) 157 may be formed and the preliminary control gate electrode layer may be etched using the third mask pattern 157 as a mask pattern to form the preliminary control gate electrodes 155.

Figure 12:
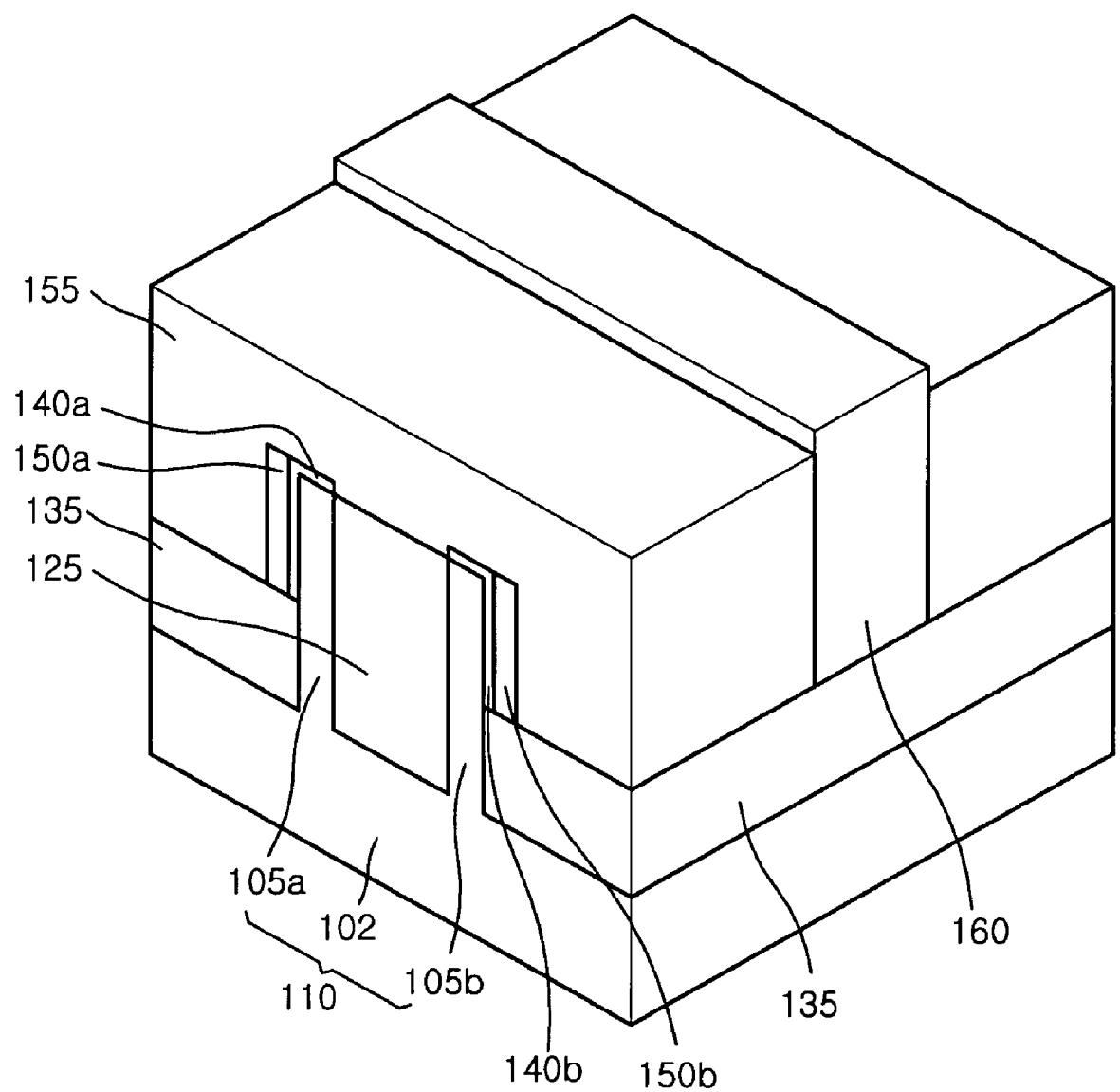

Referring to FIG. 12, the intergate insulation layer 160 may be formed between the preliminary control gate electrodes 155. The integrate insulation layer 160 may protrude or extend above the preliminary control gate electrodes 155. For example, an insulation layer (not shown) for the intergate insulation layer 160 may be formed on the structure depicted in FIG. 11, and the insulation layer may be etched until the mask pattern (157 of FIG. 11) is exposed to form the intergate insulation layer 160. The third mask pattern 157 may then be removed. The intergate insulation layer 160 may include, for example, a silicon oxide layer or a layer of a material having similar or substantially similar properties.

Figure 13:
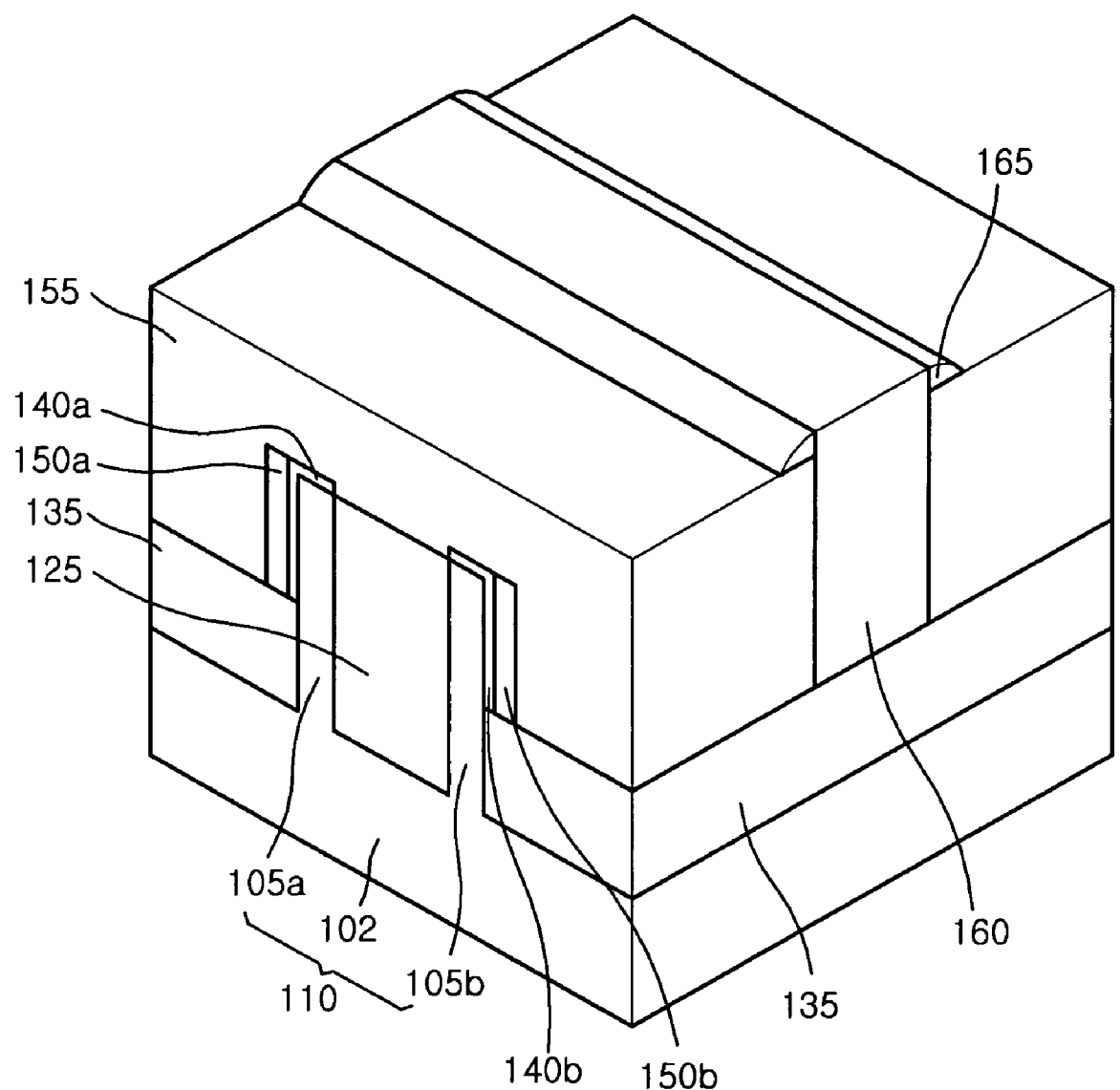

Referring to FIG. 13, second insulation spacers 165 may be formed on both sidewalls of the protruding portion of the intergate insulation layer 160. For example, a second insulation spacer layer (not shown) may be formed on the structure depicted in FIG. 12, and the second insulation spacer layer may be etched using, for example, an anisotropic etching (or any other similar) method, to form the second insulation spacers 165. The second insulation spacers 165 may each include, for example, a silicon nitride layer, although any other similar or substantially similar insulating layer may be used.

Figure 14:
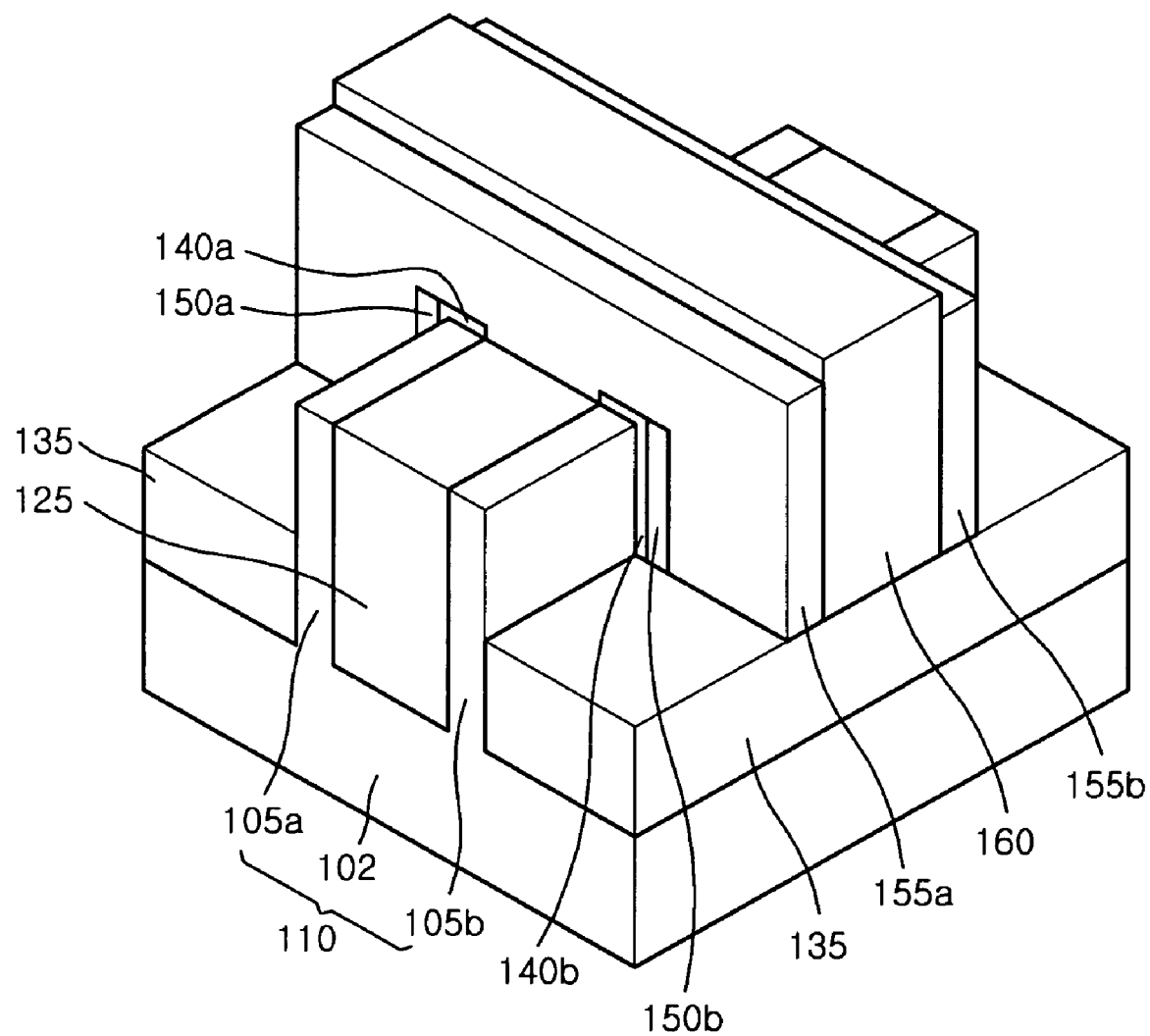

Referring to FIG. 14, a third trench may be formed on each of the preliminary control gate electrodes 155 by etching the preliminary control gate electrodes 155 using the second insulation spacers (165 of FIG. 13) as an etching mask. As a result, the pair of control gate electrodes 155a and 155b arranged on respective sidewalls of the intergate insulation layer 160 may be formed. The second insulation spacers 165 may allow the third trench region to be exposed and/or limit the widths of the control gate electrodes 155a and 155b. The control gate electrodes 155a and 155b may be supported by the intergate insulation layer 160, which may suppress the likelihood of collapse when the control gate electrodes 155a and 155b have a micro-scale line width. The second insulation spacers 165 may be removed. Alternatively in another example embodiment of the present invention, the second insulation spacers 165 may be left in place.

Using methods well-known in the art, impurity regions (170 of FIG. 4) may be formed near the surface of the fins 105a and 105b between the control gate electrodes 155a and 155b. For example, the impurity region under the intergate insulation layer 160 may be formed before the intergate insulation layer 160 is formed. The impurity region formed at the outer sides of the control gate electrodes 155a and 155b may be formed after the control gate electrodes 155a and 155b are formed.

The contact plugs (not shown) may be formed on the sidewalls near the edges of the control gate electrodes 155a and 155b. The contact plugs may correspond to the contact plugs 175a and 175b formed near the edges of the word lines WL1 and WL2 (see, e.g., FIG. 1). The contact plugs 175a and 175b may be paired and the pairs of contact plugs 175a and 175b may be formed in zigzag or staggered arrangement or pattern.

The widths of the gate electrodes 155a and the fins 105a and 105b illustrated in FIG. 14 may be the same or substantially the same as those described with respect to FIGS. 3 and 4. For example, the distance (W5 in FIG. 3) between the control gate electrodes 155a and 155b, which may correspond to the distance between the paired word lines (WL3 and WL4 of FIG. 1), may be about 0.5 F, and the distance between adjacent word lines included in respective adjacent pairs may be two times the distance between the paired word lines.

While the present invention has been shown and described with reference to example embodiments shown in the drawings, it will be understood by those of ordinary skill in the art that various changes in form and detail may be made therein without departing from the spirit and scope of the present invention as defined by the following claims.

What is claimed is:

1. A multi-bit non-volatile memory device comprising:
    a substrate including a body and at least one pair of fins, each of the at least one pair of fins including a first fin and a second fin extending above the body;
    a first insulation layer formed on the body between the first fin and the second fin;
    a plurality of pairs of control gate electrodes extending across the first insulation layer and the at least one pair of fins and partly covering upper portions of outer walls of the at least one pair of fins, each of the control gate electrodes being insulated from the substrate, and each pair of control gate electrodes being arranged adjacent to another pair of control gate electrodes;
    a plurality of storage nodes formed between the control gate electrodes and the at least one pair of fins and insulated from the substrate; and
    a plurality of pairs of contact plugs, each pair of the plurality of contact plugs contacting sidewalls of a corresponding one of a pair of control gate electrodes; wherein
    the plurality of pairs of contact plugs are arranged in a zigzag pattern so that pairs of contact plugs contacting control gate electrodes in a first pair of control gate electrodes are arranged at the same side of the substrate, but the pair of contact plugs contacting adjacent pairs of control gate electrodes are arranged at an opposite side of the substrate, and
    a first distance between each adjacent pair of control gate electrodes is greater than a second distance between the control gate electrodes in each pair.

2. The multi-bit non-volatile memory device of claim 1, wherein the first distance is about two times the second distance.

3. The multi-bit non-volatile memory device of claim 1, wherein within each of the at least one pair of fins, the first and second fins are spaced a third distance apart, the third distance being equal to the first distance.

4. The multi-bit non-volatile memory device of claim 1, further including,
    a second insulation layer formed on a portion of the body at an outer side of each of the first fin and the second fin and covering a lower portion of outer walls of each of the first fin and the second fin.

5. The multi-bit non-volatile memory device of claim 1, further including,
    a third insulation layer located between control gate electrodes in each pair of control gate electrodes.

6. The multi-bit non-volatile memory device of claim 1, wherein the storage node includes a polysilicon layer, a silicon-germanium layer, a silicon or metal area, a nano-crystal or a silicon nitride layer.

* * * * *